United States Patent [19]
Ando

[11] Patent Number: 5,285,081
[45] Date of Patent: Feb. 8, 1994

[54] FIELD EFFECT TRANSISTOR HAVING QUASI ONE-DIMENSIONAL ELECTRON GAS CONFINED UNDER ELECTRON RESONANCE

[75] Inventor: Yuji Ando, Tokyo, Japan

[73] Assignee: NEC Corporation, Tokyo, Japan

[21] Appl. No.: 986,695

[22] Filed: Dec. 8, 1992

[30] Foreign Application Priority Data

Dec. 9, 1991 [JP] Japan .................................. 3-323502

[51] Int. Cl.$^5$ ............................................. H01L 27/12
[52] U.S. Cl. ........................................ 257/24; 257/25; 257/194
[58] Field of Search ................... 257/24, 25, 192, 194

[56] References Cited

U.S. PATENT DOCUMENTS 4,581,621  4/1986  Reed ........................................ 257/20
5,157,467  10/1992 Fujii ......................................... 257/24

FOREIGN PATENT DOCUMENTS 2-100371  4/1990  Japan ....................................... 257/24

OTHER PUBLICATIONS

Hiroyuki Sakaki, "Scattering Suppression and High--Mobility Effect of Size-Quantized Electrons in . . . Structures", Japanese Journal of Applied Physics, vol. 19, No. 12, Dec., 1980, pp. L735–L738.

K. Onda et al., "Striped Channel Field Effect Transistors With A Modulation Doped Structure", IEDM 89, pp. 125-128.

Primary Examiner—Edward Wojciechowicz
Assistant Examiner—Courtney A. Bowers
Attorney, Agent, or Firm—Sughrue, Mion, Zinn, Macpeak & Seas

[57] ABSTRACT

A field effect transistor has a quantum well structure covered with an n-type cap layer, and control gate electrodes are provided on the cap layer on both sides of a gate electrode between source and drain electrodes, wherein the gate electrode and the control gate electrodes are biased in such a manner as to produce quasi one-dimensional electron gas under electron resonance for allowing current to flow between the source and drain electrodes, and the quasi one-dimensional electron gas is much narrower than the gate electrode patterned through a lithographic process so that the field effect transistor is free from controllable limits of the lithographic process.

36 Claims, 17 Drawing Sheets

FIELD EFFECT TRANSISTOR HAVING QUASI ONE-DIMENSIONAL ELECTRON GAS CONFINED UNDER ELECTRON RESONANCE

FIELD OF THE INVENTION

This invention relates to a field effect transistor and, more particularly, to a field effect transistor for inducing quasi one-dimensional electron gas.

DESCRIPTION OF THE RELATED ART

The field effect transistor for inducing quasi one-dimensional electron gas was reported by Onda et. al. in IEDM Technical Digest, page 125, 1989. FIG. 1 illustrates a typical example of the field effect transistor, and the field effect transistor is fabricated on a semi-insulating substrate 1 of gallium arsenide. A buffer layer 2 is grown on the semi-insulating substrate 1, and an electron supplying layer 3 in turn is grown on the buffer layer 2. The electron supplying layer 3 is overlain by a cap layer 4, and the buffer layer 2, the electron supplying layer 3 and the cap layer 4 are respectively formed of intentionally undoped gallium arsenide, n-type aluminum gallium arsenide and heavily doped n-type gallium arsenide, respectively, epitaxially grown through a molecular beam epitaxy. A lithographic process is applied to the resultant structure, and the cap layer 4, the electron supplying layer 3 and the buffer layer 2 are partially etched away, leaving a wire-like narrow lamination 5a between two wide laminations 5b and 5c on both sides thereof. A source electrode 6a and a drain electrode 6b are respectively formed on the wide laminations 5b and 5c, and are electrically contacted with two-dimensional electron confinement wells 7a and 7b beneath the interface between the buffer layer 2 and the electron supplying layer 3 in ohmic manner. The wide laminations 5b and 5c and, accordingly, the two-dimensional electron confinement wells 7a and 7b are spaced apart from one another by the wire-like narrow lamination 5a and, accordingly, a quasi one-dimensional channel 7c beneath the interface between the buffer layer 2 and the electron supplying layer 3. A gate electrode 6c is formed on the narrow lamination 5a, and is appropriately biased for controlling the quasi one-dimensional channel 7c. Since the cap layer 4 beneath the gate electrode 6c is completely depleted, and the conductivity of the cap layer 4 is not conducive to the drain current.

The narrow lamination 5a is as small in width as the wavelength of the de Broglie's wave, and the electrons behave as if they participates in one-dimensional electron gas. The quasi one-dimensional channel 7c takes place in the narrow lamination, and is desirable in view of high speed switching action, because elastic scattering is suppressed. Improvement in mobility under low electric field is reported by Sasaki in "Scattering Suppression and High-Mobility Effect of Size-Quantized Electrons in Ultrafine Semiconductor Wire Structure", Japanese Journal of Applied Physics, vol. 19, No. 12, December, 1980, pages L735 to L738.

As described hereinbefore, the field effect transistor using quasi one-dimensional electron gas is a potential candidate of an ultra high speed circuit component. The feasibility of the ultra high speed circuit component is dependent on dimensions of the wire-like narrow lamination. Since the buffer, electron supplying and cap layers 2, 3 and 4 are grown through the molecular beam epitaxy, the thicknesses are well controllable. However, the wire-like narrow lamination is formed through the lithographic process, and the controllable limit of the electron beam lithographic process is about 0.1 micron or 1000 angstroms. The controllable limit is ten times larger than the wavelength of electron as small as 100 angstroms, and the wire-like narrow lamination 5a of the prior art field effect transistor is not reproducible.

SUMMARY OF THE INVENTION

It is therefore an important object of the present invention to provide a field effect transistor which is free from controllable limit of a lithographic process for producing quasi one-dimensional electron gas.

To accomplish the object, the present invention proposes to confine electron gas into a quasi one-dimensional channel under electron resonance.

In accordance with the present invention, there is provided a field effect transistor fabricated on a semi-insulating substrate, comprising: a) a quantum well structure formed over the semi-insulating substrate, and having a quantum well layer of first compound semiconductor material sandwiched between first and second potential barrier layers of respective second and third compound semiconductor materials, the second and third compound semiconductor materials being smaller in electron affinity than the first compound semiconductor material, the second potential barrier layer allowing electrons to tunnel therethrough; b) a cap layer of n-type fourth compound semiconductor material covering the second potential barrier layer; c) source and drain electrodes formed on the cap layer for forming ohmic contacts, and spaced apart from one another in a first predetermined direction; d) a gate electrode formed on the cap layer between the source and drain electrodes, and forming a first Schottky barrier with the fourth compound semiconductor material, and e) control electrodes formed on the cap layer for forming second and third Schottky barriers with the fourth compound semiconductor material, and spaced apart from the gate electrode in a second predetermined direction perpendicular to the first predetermined direction, the gate electrode and the control electrodes being biased in such a manner as to produce a quasi one-dimensional electron gas in the quantum well layer under electron resonance between electron energy in the cap layer and the ground energy level in the quantum well layer for allowing current to flow between the source and drain electrodes.

BRIEF DESCRIPTION OF THE DRAWINGS

The features and advantages of the field effect transistor using one-dimensional electron gas according to the present invention will be more clearly understood from the following description taken in conjunction with the accompanying drawings in which.

DESCRIPTION OF THE PREFERRED EMBODIMENTS

First Embodiment

Figure 1:
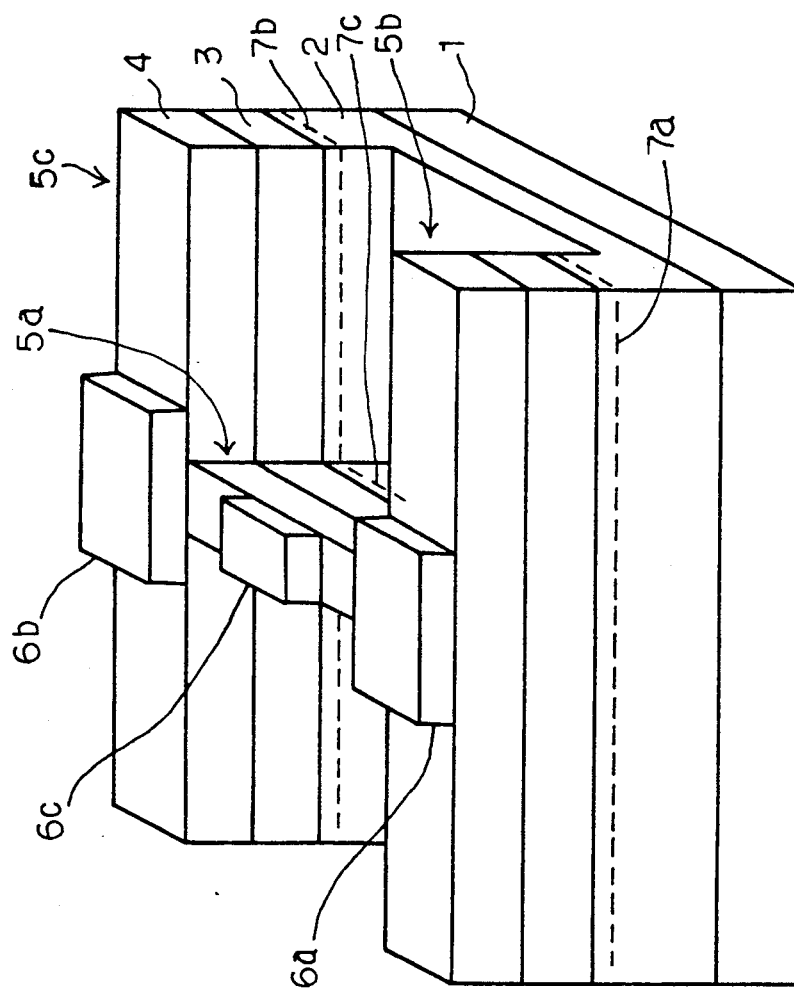
FIG. 1 is a perspectively view showing the structure of the prior art field effect transistor using quasi one-dimensional electron gas.
Figure 2:
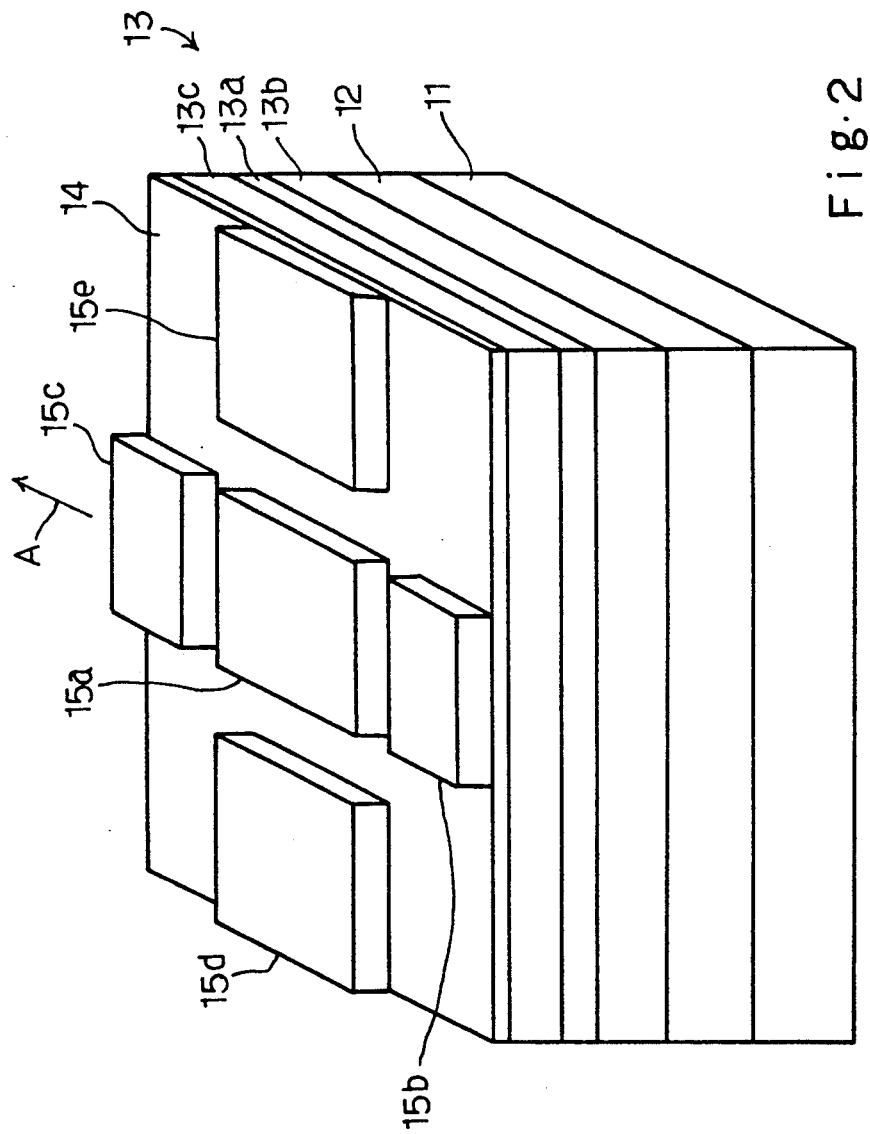
FIG. 2 is a perspective view showing the structure of a field effect transistor using quasi one-dimensional electron gas.

Referring to FIG. 2 of the drawings, a field effect transistor embodying the present invention is fabricated on a semi-insulating substrate 11 of gallium arsenide. The semi-insulating substrate 11 is overlain by a buffer layer 12, and a quantum well structure 13 is provided on the buffer layer 12. The quantum well structure 13 is overlain by a cap layer 14, and a gate electrode 15a, source and drain electrodes 15b and 15c and control electrodes 15d and 15e are arranged on the cap layer 14. In this instance, the quantum well structure 13 is implemented by a quantum well layer 13a sandwiched between potential barrier layers 13b and 13c, and the buffer layer 12, the quantum well layer 13a, the potential barrier layers 13b and 13c and the cap layer 14 are respectively formed of intentionally undoped gallium arsenide, intentionally undoped gallium arsenide, intentionally undoped aluminum gallium arsenide and heavily doped n-type gallium arsenide.

The source and drain electrodes 15b and 15c are spaced apart from the gate electrode 15a in a predetermined direction A, and a quasi one-dimensional conductive channel takes place in parallel to the predetermined direction A as will be described hereinlater. The source and drain electrodes 15b and 15c are held in contact with the quasi one-dimensional conductive channel through alloying. The gate electrode 15a forms a Schottky barrier together with the cap layer 14, and the control electrodes 15d and 15e are spaced apart from the gate electrode 15a in perpendicular to the predetermined direction A.

The field effect transistor is fabricated through the following process sequence. First, the semi-insulating substrate 11 is prepared, and the buffer layer 12, the potential barrier layer 13b, the quantum well layer 13a, the potential barrier layer 13c and the cap layer 14 are sequentially grown by using a molecular beam epitaxy. Namely, the intentionally undoped gallium arsenide layer is grown on the semi-insulating substrate 11 to thickness of 1 micron for the buffer layer 12, and the intentionally undoped aluminum gallium arsenide expressed by the molecular formula of $Al_{0.3}Ga_{0.7}As$ is grown on the buffer layer 12 to thickness of 1000 angstroms for the potential barrier layer 13b. The intentionally undoped gallium arsenide is grown on the potential barrier layer 13b to thickness of 30 angstroms for the quantum well layer 13a, and the intentionally undoped aluminum gallium arsenide is grown on the quantum well layer 13a to thickness of 50 angstroms for the potential barrier layer 13c. The potential barrier layer 13c is thin enough to allow electrons to tunnel therethrough. Finally, the n-type gallium arsenide is grown on the potential barrier layer 13c to thickness of 50 angstroms for the cap layer 14, and the donor impurity concentration is $1 \times 10^{18}$ cm$^3$. Since the aluminum gallium arsenide is smaller in electron affinity than the gallium arsenide, an electron confined well theoretically takes place in the quantum well layer 13a.

After completion of the successive growth through the molecular beam epitaxy, appropriate metal is evaporated on the top surface of the cap layer 14, and is patterned into the source and drain electrodes 15b and 15c by using a lithographic process. The source and drain electrodes 15b and 15c form ohmic contact with the quantum well layer 13a through alloying. Photo-resist solution is spun onto the entire surface for forming a photo-resist film, and the photo-resist film is patterned into a photo-resist mask through a lithographic process. The photo-resist mask exposes predetermined areas on the cap layer 14, and the predetermined areas are assigned to the gate electrode 15a and the control electrodes 15d and 15e, respectively. Appropriate metal such as aluminum is evaporated onto the entire surface of the structure, and fills the hollow spaces formed in the photo-resist mask. The metal film is thick enough to create a smooth surface, and is uniformly etched until the photo-resist mask is exposed. Finally, the photo-resist mask is lifted off, and the gate electrode 15a and the control electrodes 15d and 15e are left on the cap layer 14. In this instance, the gate electrode 15a is 0.5 micron in width and 0.5 micron in length, and is spaced apart from the control electrodes 15d and 15e by 0.3 micron. The control electrodes 15d and 15e are approximately equal in width to the gate electrode 15a. Thus, the compound semiconductor materials are grown by using the molecular beam epitaxy, and the lithographic process is used for patterning the gate and control electrodes 15a, 15d and 15e. The dimensions of the films and parts are within the controllable limits of the processes, and, accordingly, the field effect transistor is feasible.

Figure 3:
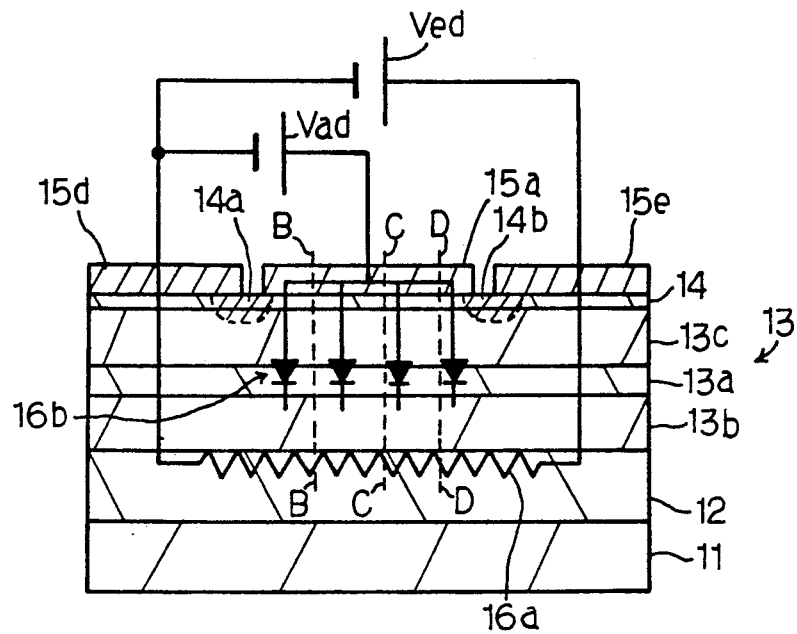
FIG. 3 is a cross sectional view taken along a perpendicular direction to the source-to-drain current path and showing the bias conditions of the gate and control electrodes incorporated in the field effect transistor.
Figure 4:
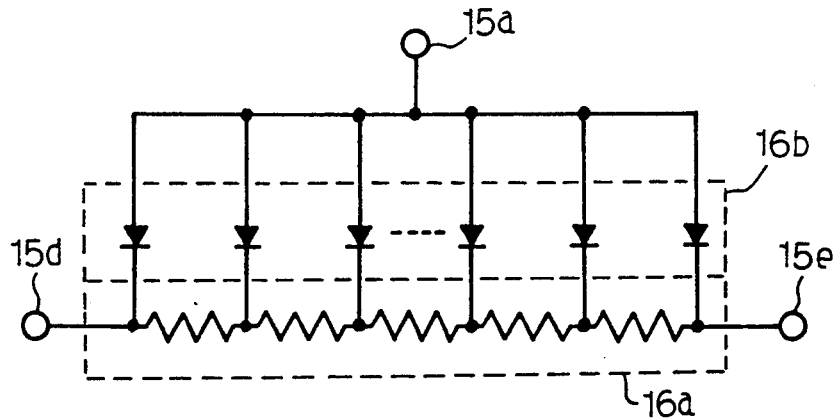
FIG. 4 is an equivalent circuit of the field effect transistor.

Although the electrodes 15a, 15d and 15e have relatively large dimensions patterned through the lithographic process, a quasi one-dimensional channel takes place in an extremely narrow area in the quantum well layer 13a under electron resonance, in detail, when the control electrode 15e and the gate electrode 15a are positively biased with respect to the control electrode 15d as shown. in FIG. 3, the cap layer 14 is completed depleted between the gate electrode 15a and the control electrodes 15d and 15e, and depletion layers 14a and 14b do not allow current to flow therebetween. The buffer layer 12 is equivalent to a resistor 16a, and the structure from the cap layer 14 to the buffer layer 12 beneath the gate electrode 15a is equivalent to a resonant tunneling diode array 16b. Therefore, an equivalent circuit is established in the field effect transistor as shown in FIG. 4. Since the control gate electrode 15e is positively biased with respect to the control electrode 15d by Ved, the resistor 16a increases the voltage level at the cathode from the left side to the right side, and, accordingly, differential voltage between the anode and the cathode is decreased from the left side to the right side. This means that potential profile beneath the gate electrode 15a is variable together with the differential voltage between the anode and the cathode as shown in FIGS. 5A to 5C.

Figure 5A:
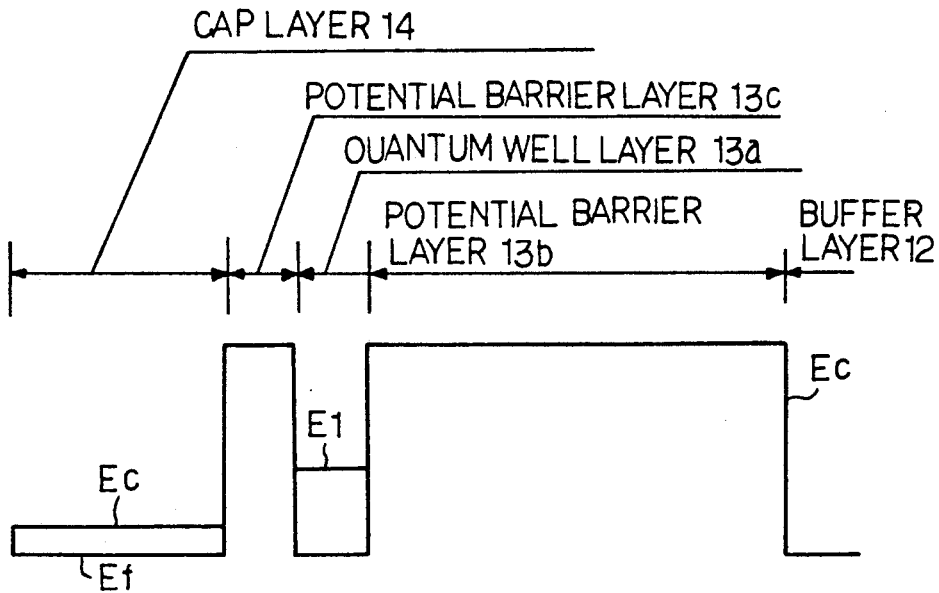
FIGS. 5A to 5C are energy band diagrams showing variation of potential profile beneath the gate electrode under biased conditions.
Figure 5B:
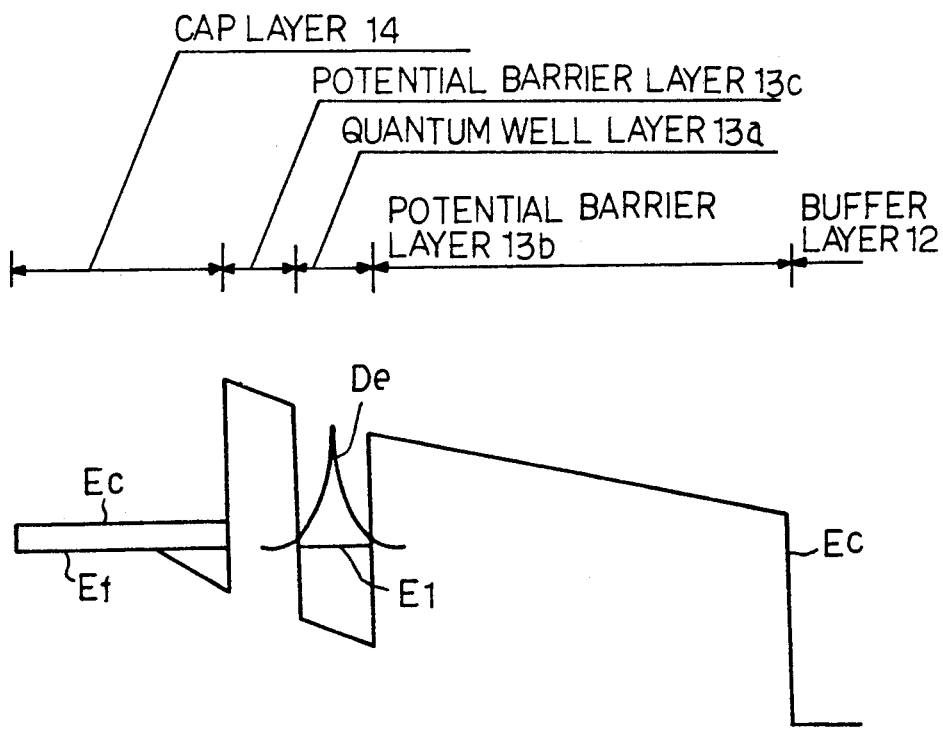
Figure 5C:
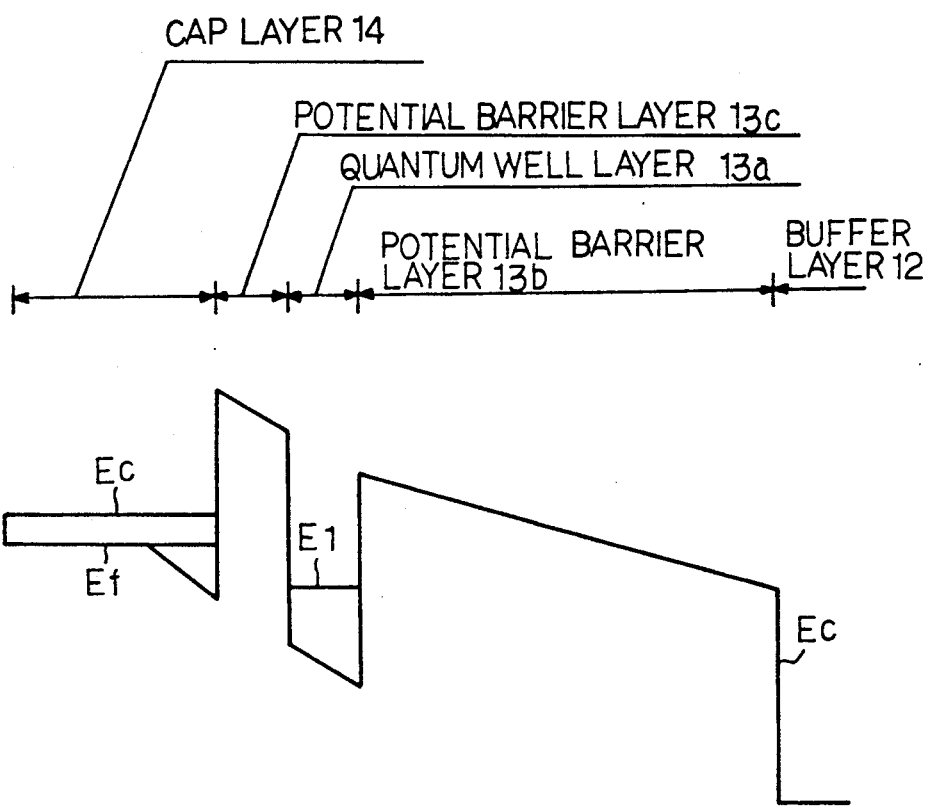

Namely, FIG. 5A shows the potential profile indicative of the bottom edge Ec of the conduction band taken along line B-B of FIG. 3, and ground energy level E1 for electrons takes place in the quantum well layer 13a, and the ground energy level E1 is higher than the Fermi level Ef. As a result, any electron does not exist in the area of the quantum well layer 13a represented by line B-B. However, if the potential profile is taken along line C-C of FIG. 3, the bottom edge Ec of the conduction band is deformed as shown in FIG. 5B due to variation of the differential voltage between the anode and the cathode, and the ground energy level E1 becomes approximately equal to the Fermi level Ef, and electrons takes place in the area of the quantum well layer 13a represented by line C-C. The electrons distributes as indicated by distribution curve De. If the potential profile is taken along line D-D, the bottom edge Ed of the conduction band is further deformed due to the differential voltage between the anode and the cathode, and the ground energy level E1 is moved below the conduction band of the cap layer 14 as shown in FIG. 5C. Therefore, any electron does not exist in the quantum well layer 13a. The potential profile is continuously deformed through those shown in FIGS. 5A to 5C in the direction perpendicular to the arrow A of FIG. 2, and electrons can exist a wire-like extremely narrow area.

In this instance, the gate electrode 15a is 0.5 micron in width. If the control electrode 15e is higher in voltage level than the control electrode 15d by 1 volt, the differential voltage of 1 volts can be assumed to be also applied between both sides of the buffer layer 12, and resonant conditions are established in particular area of the quantum well layer 13a where the ground energy level E1 is matched with the electron energy in the n-type cap layer 14. In this instance, the electron energy in the n-type cap layer 14 is about 50 meV equivalent to the Fermi level, and the width of the particular area is 50/1000 = 1/20 of the width of the gate electrode 15a on the assumption the positive voltage Vad is uniformly applied over the gate electrode 15a. As a result, the particular area is as narrow as 250 angstroms, and the electrons are confined in such an extremely narrow area in this instance. The particular area corresponds to the wavelength of electron, and the electron gas is confined in the particular area. The gate electrode 15a is accompanied with the control electrodes 15d and 15e along the length thereof, and, accordingly, the variation of the potential profile is continuous in the direction of the arrow A. This results in that the particular area continues in the direction of the arrow A, and quasi one-dimensional electron gas takes place in the quantum well layer 13a under the source and drain electrodes 15b and 15c.

Figure 6:
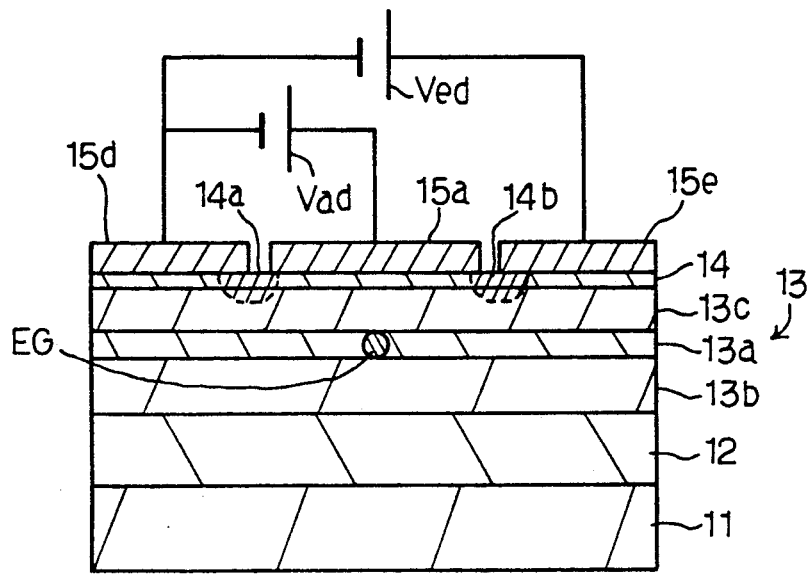
FIG. 6 is a cross sectional view taken along the perpendicular direction to the source-to-drain path for describing behavior of the field effect transistor.
Figure 7:
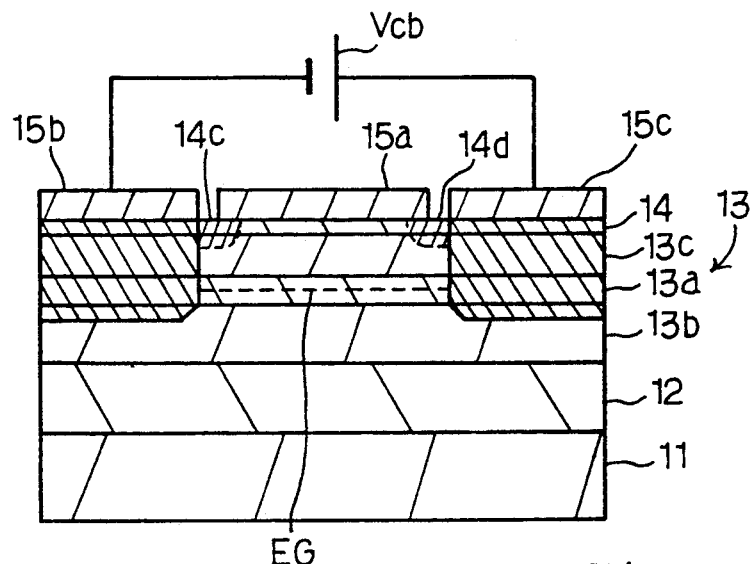
FIG. 7 is a cross sectional view taken along the source-to-drain path for describing the behavior of the field effect transistor.

Description is hereinbelow made on behavior of the field effect transistor with reference to FIGS. 6 and 7. As described hereinbefore, when the gate electrode 15a and the control electrode 15e are biased at Vad and Ved with respect to the control electrode 15d, the electron resonance takes place between the electron energy in the cap layer 14 and the ground energy level E1, and the quasi one-dimensional electron gas EG is produced in the quantum well layer 13a. In this situation, if differential voltage Vcb is applied between the source electrode 15b and the drain electrode 15c, depletion layers 14c and 14d isolate the gate electrode 15a from the source and drain electrodes 15b and 15c, and the one-dimensional electron gas EG flows along the extremely narrow quasi-one dimensional channel.

However, if the differential voltage Vad is changed toward the negative level, any one-dimensional electron gas EG takes place in the quantum well layer 13a, and no current flows between the source and drain electrodes 15b and 15c. Thus, the current of the field effect transistor is modulated by using the differential voltage Vad under the effects of the electric field.

Even if the current flows between the source and drain electrodes 15b and 15c, the resonant conditions keep the electron gas EG quasi one-dimensional, and the current is hardly affected by the elastic scattering. For this reason, extremely high electron mobility is achieved by the quasi one-dimensional electron gas EG, and the field effect transistor achieves high switching speed.

Second Embodiment

Figure 8:
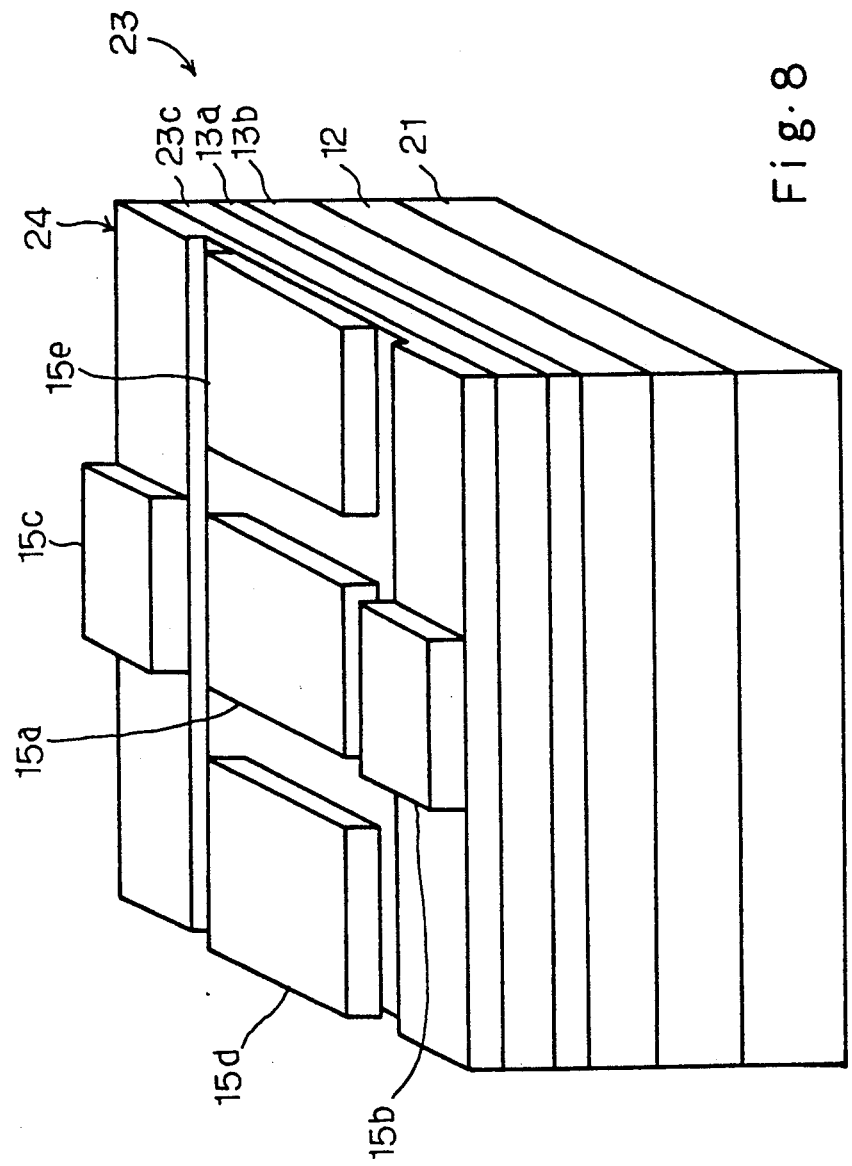
FIG. 8 is a perspective view showing the structure of another field effect transistor according to the present invention.

Turning to FIG. 8 of the drawings, another field effect transistor embodying the present invention is fabricated on a semi-insulating substrate 21. A buffer layer, a potential barrier layer, a quantum well layer, a gate electrode, control electrodes and source and drain electrodes are corresponding to those of the first embodiment, and are labeled with the same references.

A first difference from the first embodiment is an upper potential barrier layer 23c over the quantum well layer 13a, and the upper potential barrier layer 23c is formed of n-type aluminum gallium arsenide doped at $3 \times 10^{18}$ cm$^3$. The quantum well structure thus arranged is labeled with reference numeral 23. The upper potential barrier layer 23c thus doped with n-type dopant impurity serves as not only a potential barrier against electron confined into the quantum well layer 13a but also an electron supplying facility to the quasi one-dimensional electron gas. For this reason, electrons are induced in the quasi one-dimensional electron gas under the electron resonance, and are further supplied from the electron supplying facility. As a result, the field effect transistor implementing the second embodiment is improved in current driving capability.

A second difference from the first embodiment is a cap layer 24 partially recessed. The cap layer 24 is also formed of n-type gallium arsenide, and the central portion is recessed to a thickness less than that of the depletion layer. The gate electrode 15a and the control electrodes 15d and 15e are located on the recess region of the cap layer 24, and the source and drain electrodes 15b and 15c are located on the thick portions outside the recess region. Thus, the recess region perfectly prevents the cap layer 24 from undesirable current, because the depletion layers extend over the cap layer in the direction of thickness.

Third Embodiment

Figure 9:
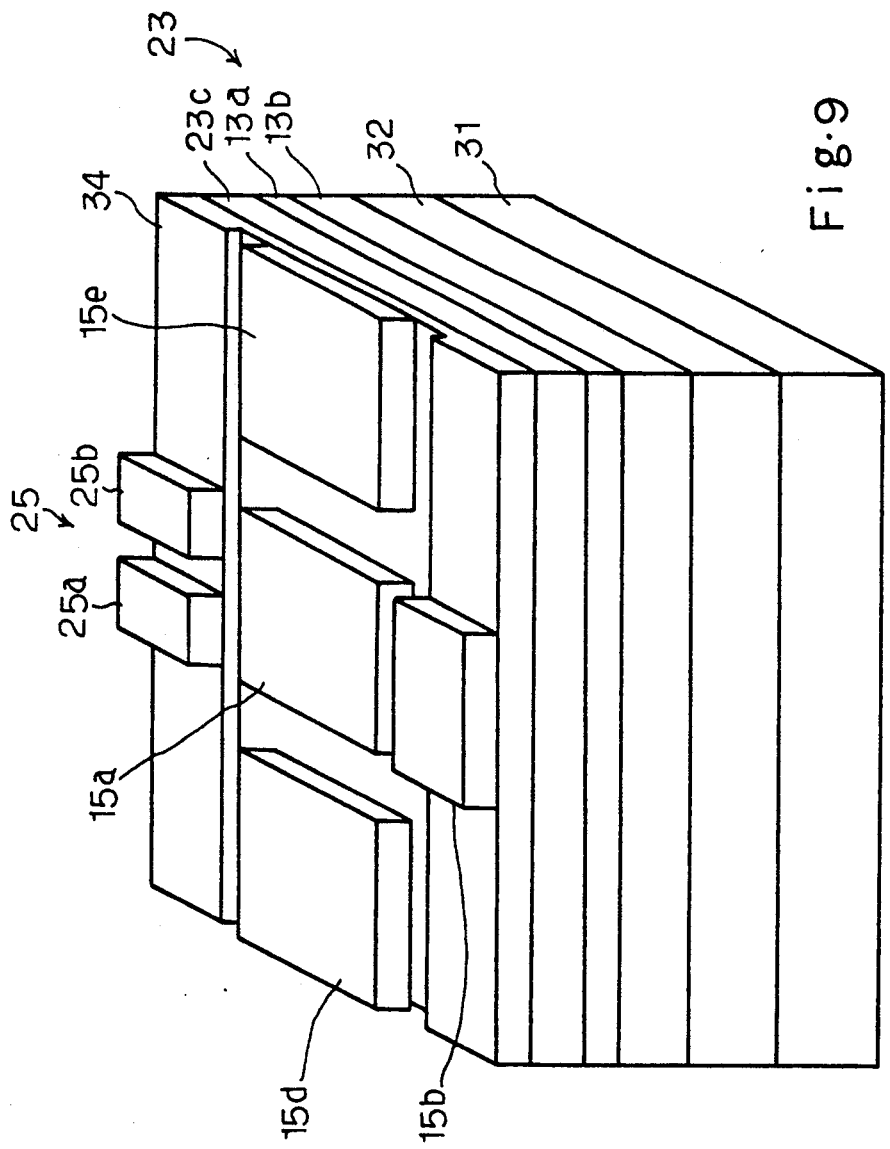
FIG. 9 is a perspective view showing the structure of yet another field effect transistor according to the present invention.

Turning to FIG. 9 of the drawings, yet another field effect transistor embodying the present invention is fabricated on a semi-insulating substrate 31 of gallium arsenide. The semi-insulating substrate 31 is overlain by a buffer layer 32 of n-type gallium arsenide doped at $1 \times 10^{16} cm^{-3}$, and a quantum well structure 23 similar to that of the second embodiment is fabricated on the buffer layer 32. On the quantum well structure is further formed a cap layer 34 which is formed of heavily doped n-type gallium arsenide doped at $5 \times 10^{18}$ cm$^3$. The cap layer 34 is also partially decreased in thickness, and a gate electrode 15a and control electrodes 15d ad 15e are formed on the recess region of the cap layer 34. The recess region allows the depletion layers to perfectly isolate the gate electrode 15a from the control gate electrodes 15d and 15e as well as from the source electrode 15b and a drain electrode 25 located on the thick portions of the cap layer 34. The drain electrode 25 is implemented by first and second drain sub-electrodes electrically isolated from each other.

The field effect transistor shown in FIG. 9 is fabricated through the following process sequence. First, the semi-insulating substrate 31 is prepared, and a molecular beam epitaxy is applied to the semi-insulating substrate 31. Namely, on the semi-insulating substrate 31 are sequentially grown n-type gallium arsenide, intentionally undoped aluminum gallium arsenide expressed as $Al_{0.3}Ga_{0.7}As$, intentionally undoped gallium arsenide, n-type aluminum gallium arsenide expressed as $Al_{0.3}Ga_{0.7}As$ and n-type gallium arsenide which are 2000 angstroms, 1000 angstroms, 30 angstroms, 50 angstroms and 500 angstroms in thickness, respectively, for serving as the buffer layer 32, the potential barrier layer 13b, the quantum well layer 13a, the potential barrier layer 23c and the cap layer 34.

Subsequently, suitable metal is evaporated onto the cap layer 34, and is patterned into the source and drain electrodes 15b and 25. The metal is alloyed so as to form ohmic contact with a quasi one-dimensional conductive channel formed in the quantum well layer 13a. However, the alloy terminates at the potential barrier layer 13b, and does not reach the n-type buffer layer 32 because of the conductivity of the buffer layer 32.

After the cap layer 34 is partially etched away, appropriate metal is deposited and patterned to the gate electrode 15a and the control electrodes 15d and 15e through lithographic techniques. The gate electrode 15a is perfectly isolated from the control gate electrodes 15d and 15e and the source and drain sub-electrodes 45ba, 25a and 25b, because the recess region of the cap layer 34 is thin enough to perfectly deplete under bias conditions. .

Although the gate electrode 15a and the control electrodes 15d and 15e are patterned through the lithographic techniques, the quasi-one dimensional electron gas EG is confined within a wire-like area much narrower than the gate electrode 15a, and the field effect transistor implementing the third embodiment is also free from the controllable limits of the lithographic techniques.

Figure 10A:
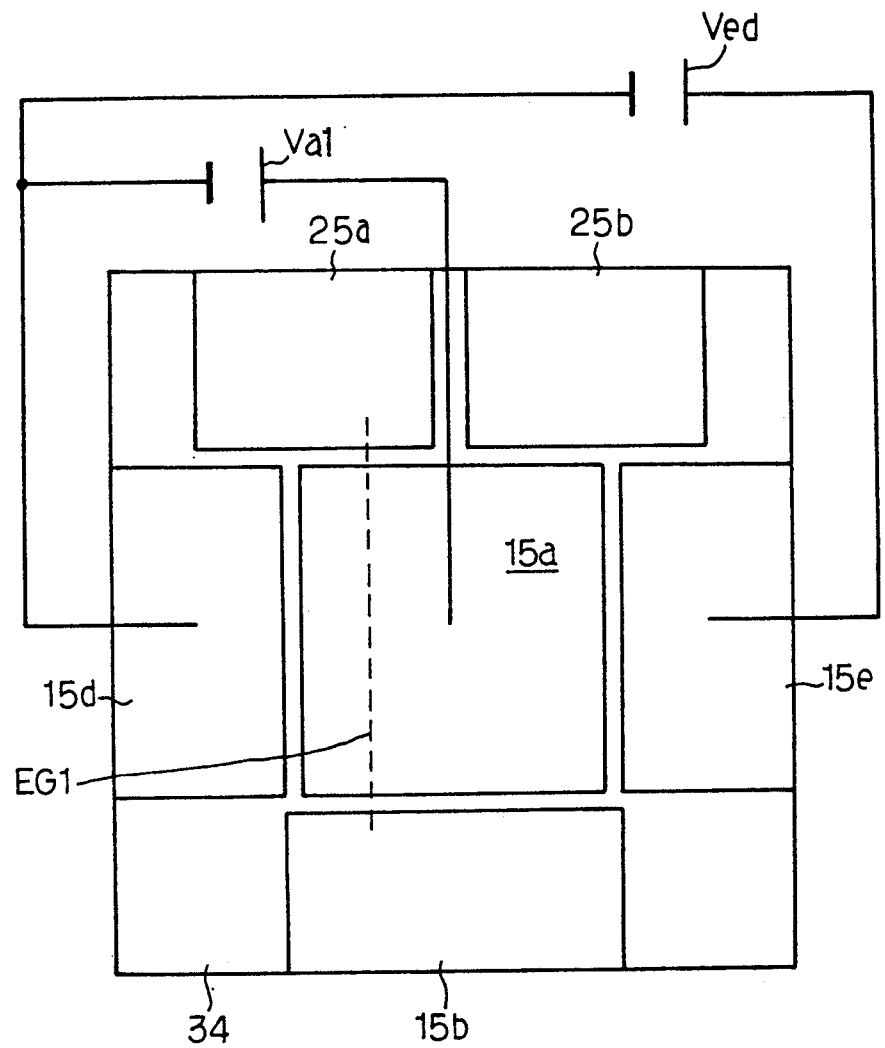
FIGS. 10A and 10B are plan views showing the quasi one-dimensional electron gas with respect to the electrodes incorporated in the field effect transistor shown in FIG. 9.
Figure 10B:
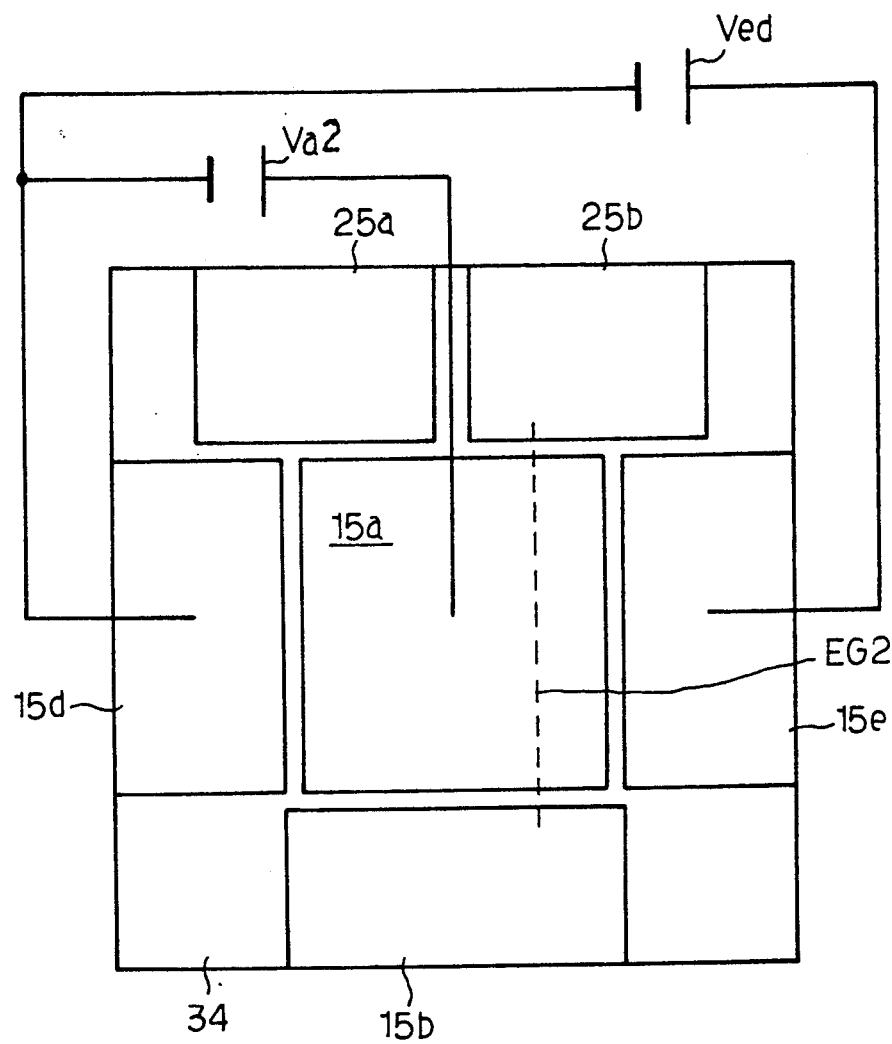

The field effect transistor thus constructed behaves as follows. As described hereinbelow, a quasi one-dimensional electron gas EG takes place in the quantum well layer 13a under the appropriate bias conditions between the control electrode 15d, the gate electrode 15a and the control electrode 15e, and is confined within a quasi one-dimensional conductive channel where the differential voltage satisfies the electron resonant condition between the electron energy in the cap layer 34 and the ground energy level E1. However, if the differential voltage Vad is changed, the quasi one-dimensional conductive channel is laterally moved. For example, if a relatively small positive voltage Va1 is applied to the gate electrode 15a, the quasi one-dimensional conductive channel is located as indicated by broken lines EG1, and current flows from the source electrode 15b to the drain sub-electrode 25a. However, if a relatively large positive voltage Va2 with respect to the control electrode 14d is applied to the gate electrode 15a, the electron resonance takes place at an extremely narrow area closer to the control electrode 15e, and, accordingly, the quasi one-dimensional conductive channel is laterally moved toward the control electrode 15e as indicated by broken lines EG2 in FIG. 10B. As a result current flows from the source electrode 15b to the drain sub-electrode 25b.

Thus, the field effect transistor shown in FIG. 9 serves as a switching element, and the source electrode 15b is selectively conducted with either drain sub-electrode 25a or 25b.

Fourth Embodiment

Figure 11:
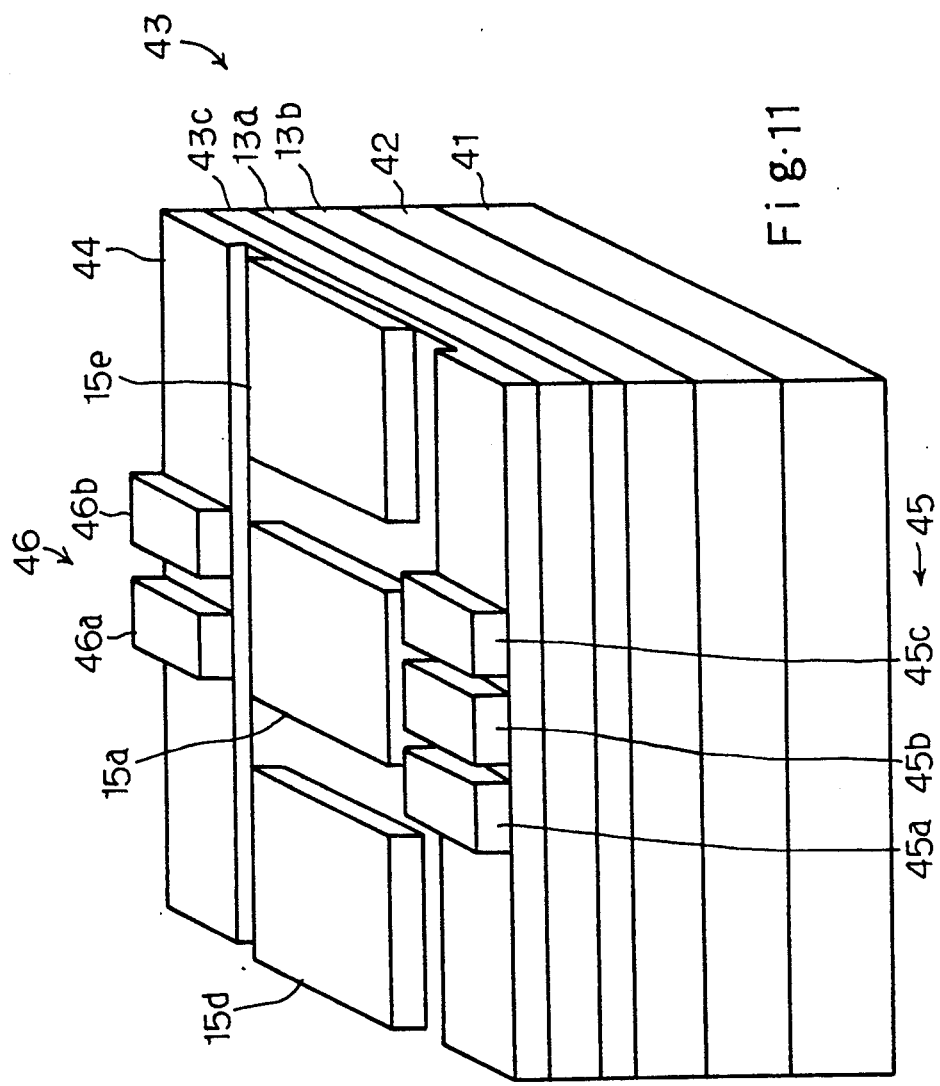
FIG. 11 is a perspective view showing still another field effect transistor according to the present invention.
Figure 12B:
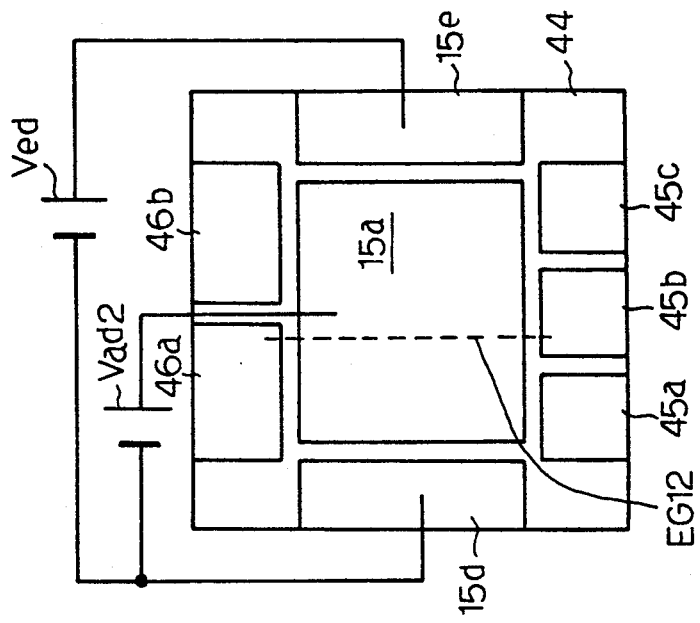
FIGS. 12A to 12D are plan views showing the quasi one-dimensional electron gas with respect to the electrodes incorporated in the field effect transistor shown in FIG. 11.
Figure 12A:
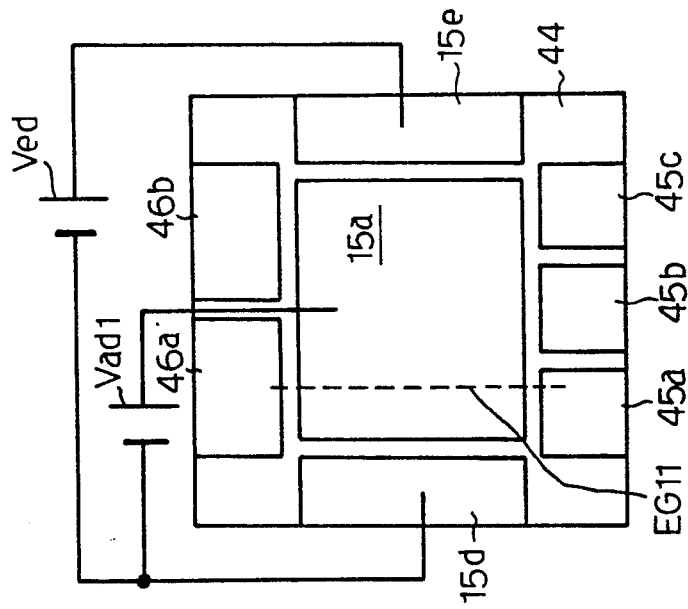
Figure 12C:
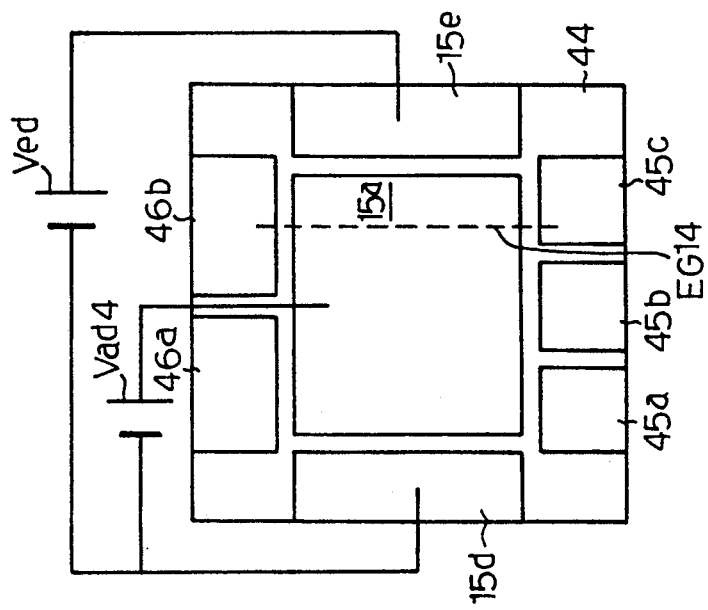
Figure 12D:
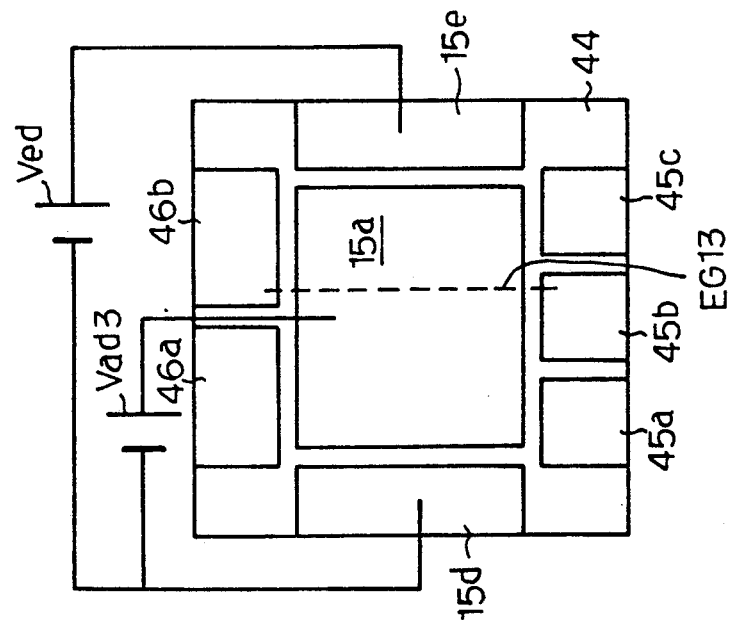

Turning to FIG. 11 of the drawings, still another field effect transistor embodying the present invention is fabricated on a semi-insulating substrate 41 of gallium arsenide. A lower potential barrier layer, a quantum well layer, a gate electrode and control electrodes are corresponding to those of the first embodiment, and are labeled with the same references without detailed description. A buffer layer 42 is formed between the semi-insulating substrate 41 and the lower potential barrier layer 13b, and is doped with donor impurity at $1 \times 10^{16}$ cm$^{-3}$. An upper potential barrier layer 43c of a quantum well structure 43 is also doped with donor impurity at $3 \times 10^{18}$ cm$^{-3}$, and serves as not only a potential barrier against confined electron but also an electron supplying facility to a quasi one-dimensional electron gas. A cap layer 44 on the quantum well structure 43 is doped with donor impurity at $5 \times 10^{18}$ cm$^{-3}$, and has a recess region and thick portions. The gate electrode 15a and the control electrodes 15d and 15e are formed on the thin portion as similar to the third embodiment, and the thick portions are respectively assigned to a source electrode 45 and a drain electrode 46. In this instance, the source electrode 45 is implemented by three source sub-electrodes 45a, 45b and 45c electrically isolated from one another, and the drain electrode 46 is constituted by two drain sub-electrodes 46a and 46b also electrically isolated from one another.

The field effect transistor shown in FIG. 11 is fabricated through the following process sequence. First, the semi-insulating substrate 41 is prepared, and a molecular beam epitaxy is applied to the semi-insulating substrate 41. Namely, on the semi-insulating substrate 41 are sequentially grown n-type gallium arsenide, intentionally undoped aluminum gallium arsenide expressed as $Al_{0.}$ $_3Ga_{0.7}As$, intentionally undoped gallium arsenide and n-type aluminum gallium arsenide and n-type gallium arsenide which are 2000 angstroms, 1000 angstroms, 30 angstroms, 50 angstroms and 500 angstroms in thickness, respectively, for serving as the buffer layer 42, the potential barrier layer 13b, the quantum well layer 13a, the potential barrier layer 43c and the cap layer 44.

Subsequently, suitable metal is evaporated onto the cap layer 34, and is patterned into the source and drain sub-electrodes 45a to 45c and 46a and 46b. The metal is alloyed so as to form ohmic contact with a quasi one-dimensional conductive channel formed in the quantum well layer 13a. However, the alloy terminates at the potential barrier layer 13b, and does not reach the n-type buffer layer 42 because of the conductivity of the buffer layer 42.

After the cap layer 44 is partially etched away, appropriate metal is deposited and patterned to the gate electrode 15a and the control electrodes 15d and 15e through lithographic techniques. The gate electrode 15a is perfectly isolated from the control gate electrodes 15d and 15e and the source and drain sub-electrodes 45a to 45c ad 46a and 46b, because the thin portion of the cap layer 44 is thin enough to perfectly deplete under bias conditions.

Although the gate electrode 15a and the control electrodes 15d and 15e are patterned through the lithographic techniques, the quasi-one dimensional electron gas is confined within a wire-like area much narrower than the gate electrode 15a, and the field effect transistor implementing the fourth embodiment is also free from the controllable limits of the lithographic techniques.

In operation, the voltage level at the gate electrode 15a is step-wise changed from the smallest positive value to the largest positive value, and the quasi one dimensional conductive channel is laterally moved as shown in FIGS. 12A to 12D. In detail, while the differential voltage between the control electrode 15d and the gate electrode 15a is the smallest positive value Vad1, the quasi one-dimensional conductive channel is located as indicated by broken lines EG11 in FIG. 12A, and current flows from the source sub-electrode 45a to the drain sub-electrode 46a. If the differential voltage is increased to the positive value Vad2, the quasi one-dimensional conductive channel is located as indicated by broken lines EG12 in FIG. 12B, and current flows from the source sub-electrode 45b to the drain sub-electrode 46a. If the differential voltage is further increased to the positive value Vad3, the quasi one-dimensional conductive channel is located as indicated by broken lines EG13 in FIG. 12C, and current flows from the source sub-electrode 45b to the drain sub-electrode 46b. Finally, if the differential voltage is increased to the largest positive value Vad4, the quasi one-dimensional conductive channel is located as indicated by broken lines EG14 in FIG. 12D, and current flows from the source sub-electrode 45c to the drain sub-electrode 46b. Thus, the quasi one-dimensional conductive channel interconnects one of the source sub-electrode 45a, 45b or 45c and one of the drain sub-electrodes 46a or 46b, and the field effect transistor implementing the fourth embodiment serves as a switching element.

Fifth Embodiment

Figure 13:
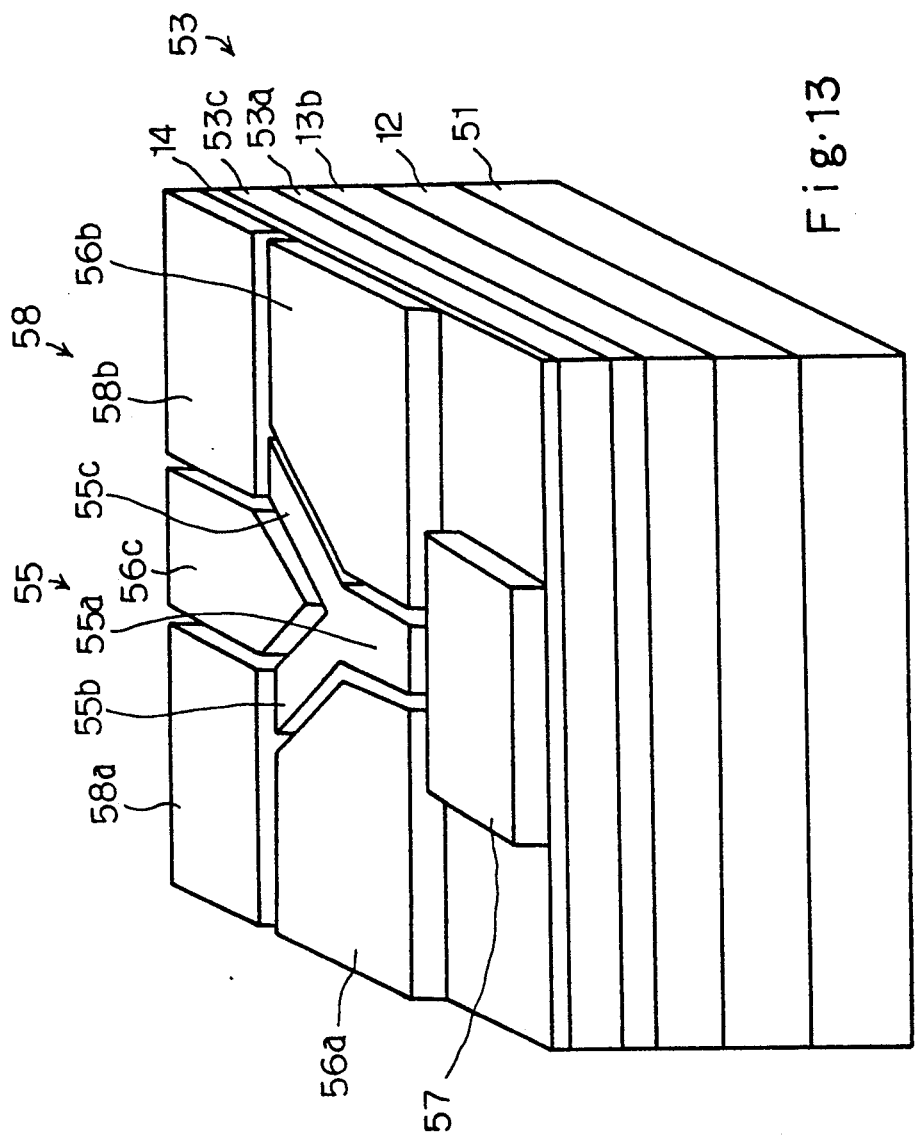
FIG. 13 is a perspective view showing the structure of yet another field effect transistor according to the present invention.

Turning to FIG. 13 of the drawings, yet another field effect transistor embodying the present invention is fabricated on a semi-insulating substrate 51 of gallium arsenide. A buffer layer, a lower potential barrier layer and a cap layer are corresponding to those of the first embodiment, and are labeled with the same references without detailed description. A quantum well layer 53a of a quantum well structure 53 is formed of intentionally undoped indium gallium arsenide expressed as $In_{0.15}Ga_{0.85}As$, and an upper potential barrier layer 53c is formed of intentionally undoped aluminum gallium arsenide expressed as $Al_{0.3}Ga_{0.7}As$. Although indium gallium arsenide is different in lattice constant from gallium arsenide, the quantum well layer 53a is decreased in thickness below the critical value where mis-fit dislocation takes place, and elastic strain regulates the lattice mis-match so as to produce an excellent interface.

A gate electrode 55 is shaped into Y-letter, and, accordingly, has a stem portion 55a and branch portions 55b and 55c bifurcated from the stem portion 55a. Three control electrodes 56a, 56b and 56c are provided in association with the gate electrode 55, and are confronted to the stem and branch portions 55a and 55b, the stem and branch portions 55a and 55c and the branch portions 55b and 55c, respectively. In order to make the control electrode 56c close to the branch portions 55b and 55c, the leading end portion of the control electrode 56c is shaped into wedge. A single source electrode 57 is confronted with the stem portion 55a, and two drain sub-electrodes 58a and 58b are respectively confronted with the branch portions 55b and 55c on both sides of the control electrode 56c. The drain sub-electrodes 58a and 58b form in combination a drain electrode 58. The cap layer 14 is so thin that depletion layers can electrically isolate the gate electrode 55 from the control gate electrodes 56a to 56c and the source and drain electrodes 57 and 58 under appropriate bias conditions.

The field effect transistor shown in FIG. 13 is fabricated through the following process sequence. First, the semi-insulating substrate 51 is prepared, and the buffer layer 12, the quantum well structure 53 and the cap layer 14 are sequentially laminated through a molecular beam epitaxy. Namely, on the semi-insulating substrate 51 are sequentially grown intentionally undoped gallium arsenide, intentionally undoped aluminum gallium arsenide expressed as $Al_{0.3}Ga_{0.7}As$, intentionally undoped indium gallium arsenide expressed as $In_{0.15}Ga_{0.85}As$, intentionally undoped aluminum gallium arsenide expressed as $Al_{0.3}Ga_{0.7}As$ and n-type gallium arsenide which are 1 micron, 1000 angstroms, 50 angstroms, 50 angstroms and 50 angstroms in thickness, respectively.

Subsequently, suitable metal is evaporated onto the cap layer 14, and is patterned into the source electrode 57 and the drain sub-electrodes 58a and 58b. The metal patterned into the source and drain electrodes 57 and 58 is alloyed so as to form ohmic contact with a quasi one-dimensional conductive channel formed in the quantum well layer 13a, and the alloy may penetrate into the buffer layer 12. Appropriate metal is deposited and patterned to the gate electrode 55 ad the control electrodes 56a to 56c through lithographic techniques. Although the gate electrode 55 and the control electrodes 56a to 56c are patterned through the lithographic techniques, the quasi-one dimensional electron gas is confined within a wire-like area much narrower than the gate electrode 55, and the field effect transistor implementing the fifth embodiment is free from the controllable limits of the lithographic techniques.

Figure 14A:
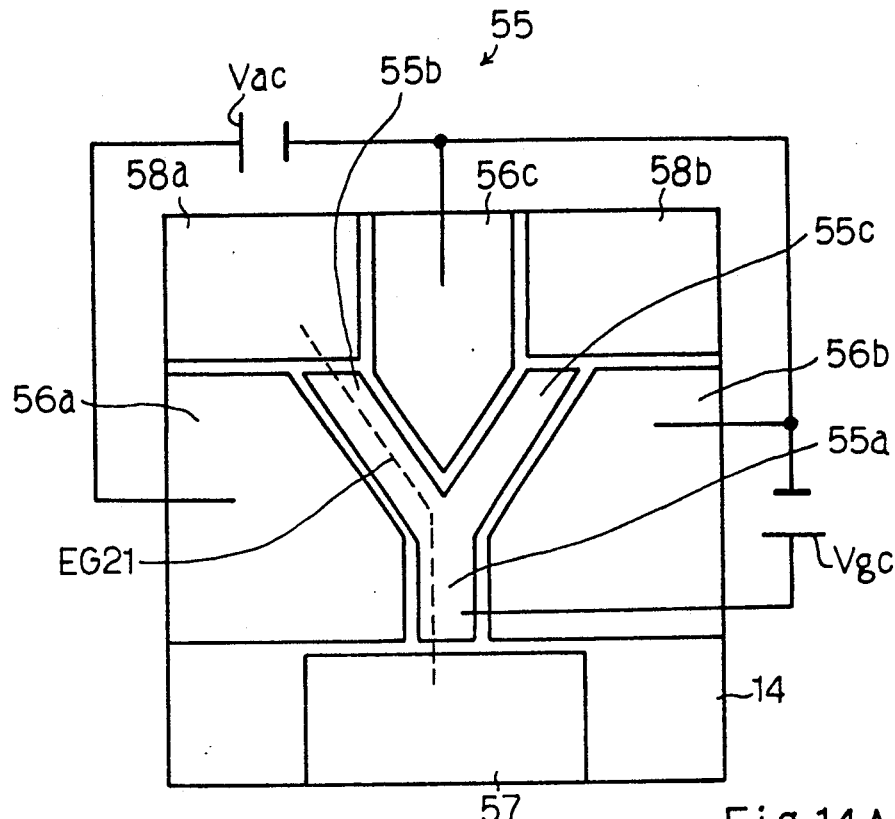
FIGS. 14A and 14B are plan views showing the quasi one-dimensional electron gas with respect to the electrodes incorporated in the field effect transistor shown in FIG. 13.
Figure 14B:
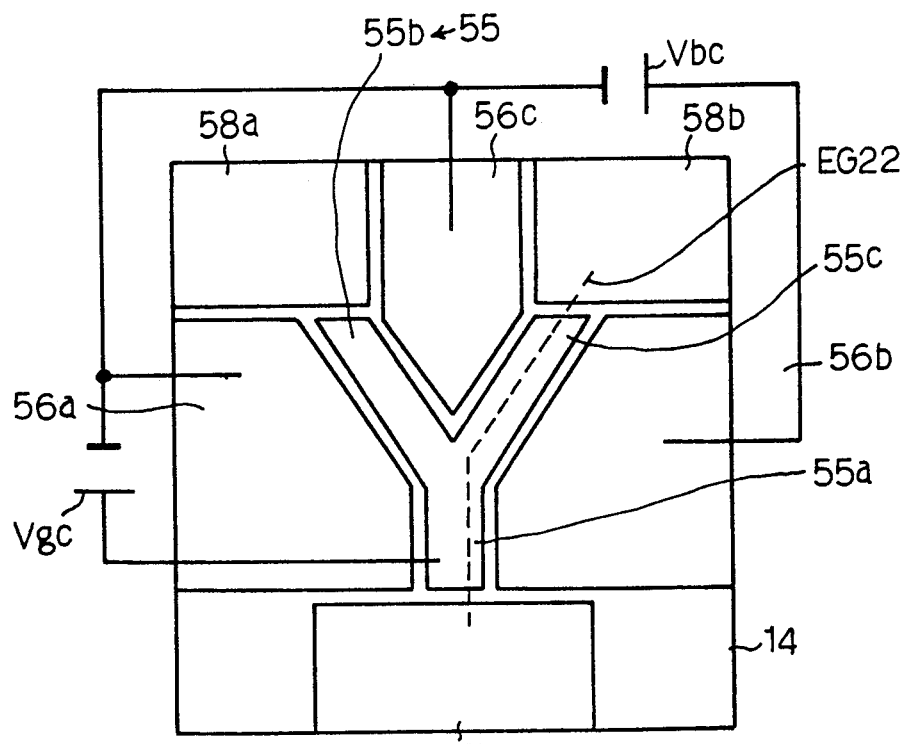

In operation, the gate electrode 55 is positively biased with respect to the control electrode 56c, and either control electrode 56a or 56b is positively biased with respect to the control electrode 56c. If the control electrode 56a is positive biased and the control electrodes 56b and 56c are kept equipotential as shown in FIG. 14A, quasi one-dimensional electron gas takes place in the quantum well layer 13a along the stem portion 55a and the branch portion 55b as indicated by broken lines EG21, because the stem and branch portions 55a and 55b are confronted with the control electrode 56a positively biased. However, the resonant conditions is not established across the branch portion 55c due to the equipotential level between the control electrodes 56b and 56c, and, for this reason, any quasi one-dimensional electron gas is produced in the potential well layer 13a along the branch portion 55c therebetween. As a result, current flows from the source electrode 57 to the drain sub-electrode 58a.

If, on the other hand, the control electrode 56b is positively biased with respect to the control electrodes 56a and 56c, quasi one-dimensional electron gas takes place in the quantum well layer 13a along the stem and branch portions 55a and 55c as indicated by broken lines EG22. However, any quasi one-dimensional electron gas is produced along the branch portion 55b. For this reason, current flows from the source electrode 57 to the drain sub-electrode 58b only. Thus, the current is steered between the drain sub-electrodes 58a and 58b depending upon the biasing conditions between the control electrodes 56a to 56c, and the field effect transistor implementing the fifth embodiment serves as a switching element.

Sixth Embodiment

Figure 15:
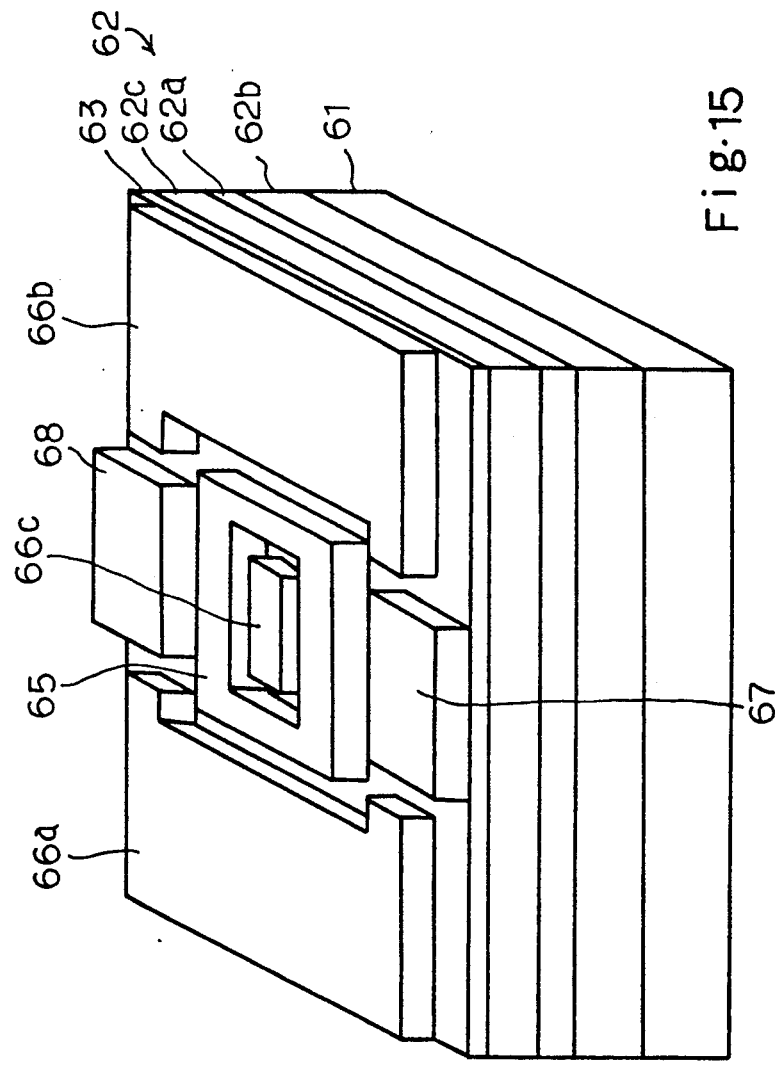
FIG. 15 is a perspective view showing the structure of still another field effect transistor according to the present invention.

Turning to FIG. 15 of the drawings, still another field effect transistor embodying the present invention is fabricated on a semi-insulating substrate 61 of indium phosphide. A quantum well structure 62 is fabricated on the semi-insulating substrate 61, and comprises a quantum well layer 62a of intentionally undoped indium gallium arsenide sandwiched between a buffer layer 62b and a potential barrier layer 62c both formed of intentionally undoped indium aluminum arsenide. The indium gallium arsenide is expressed by the chemical formula of $In_{0.53}Ga_{0.47}As$, and the indium aluminum arsenide is expressed as the chemical formula of $In_{0.52}Al_{0.48}As$. The potential barrier layer 62c is thin enough to allow electrons to tunnel therethrough under the electron resonance. The quantum well structure 62 is overlain by a cap layer 63 of n-type indium gallium arsenide expressed as $In_{0.53}Ga_{0.47}As$, and the n-type indium gallium arsenide is doped with donor impurity at $5 \times 10^{18}$ cm$^{-3}$. The cap layer 63 is so thin that depletion layers can reach the interface between the potential barrier layer 62c and the cap layer 63.

A gate electrode 65 is shaped into looped configuration, and, accordingly, a hollow space is formed inside the gate electrode 65. Control electrodes 66a, 66b and 66c are provided in association with the gate electrode 65. The control electrodes 66a and 66b are located outside the looped gate electrode 65, and are confronted with two edges of the looped gate electrode 65. However, the control electrode 66c is accommodated in the hollow space, and is, accordingly, located inside the looped gate electrode 65. The control electrode 66c is confronted with the two edges, and, for this reason, the two edges are located between the control electrodes 66a and 66b and the control electrode 66c. Source and drain electrodes 67 and 68 are located outside the looped gate electrode 65, and are confronted with the other two edges of the gate electrode 65.

The field effect transistor shown in FIG. 15 is fabricated through the following process sequence. First, the semi-insulating substrate 61 is prepared, and the quantum well structure 62 and the cap layer 63 are sequentially laminated through a molecular beam epitaxy. Namely, on the semi-insulating substrate 61 are sequentially grown intentionally undoped indium aluminum arsenide, intentionally undoped indium gallium arsenide, intentionally undoped indium aluminum arsenide and n-type indium gallium arsenide which are 1 micron, 50 angstroms, 50 angstroms and 50 angstroms in thickness, respectively.

Subsequently, suitable metal is evaporated onto the cap layer 63, and is patterned into the source and drain electrodes 67 and 68. The metal patterned into the source and drain electrodes 67 and 68 is alloyed so as to form ohmic contact with a quasi one-dimensional conductive channel formed in the quantum well layer 62a. Appropriate metal is deposited and patterned to the gate electrode 65 and the control electrodes 66a to 66c through lithographic techniques. Although the gate electrode 65 and the control electrodes 66a to 66c are patterned through the lithographic techniques, the quasi-one dimensional electron gas is confined within a wire-like area much narrower than the gate electrode 65, and the field effect transistor implementing the sixth embodiment is free from the controllable limits of the lithographic techniques.

Figure 16:
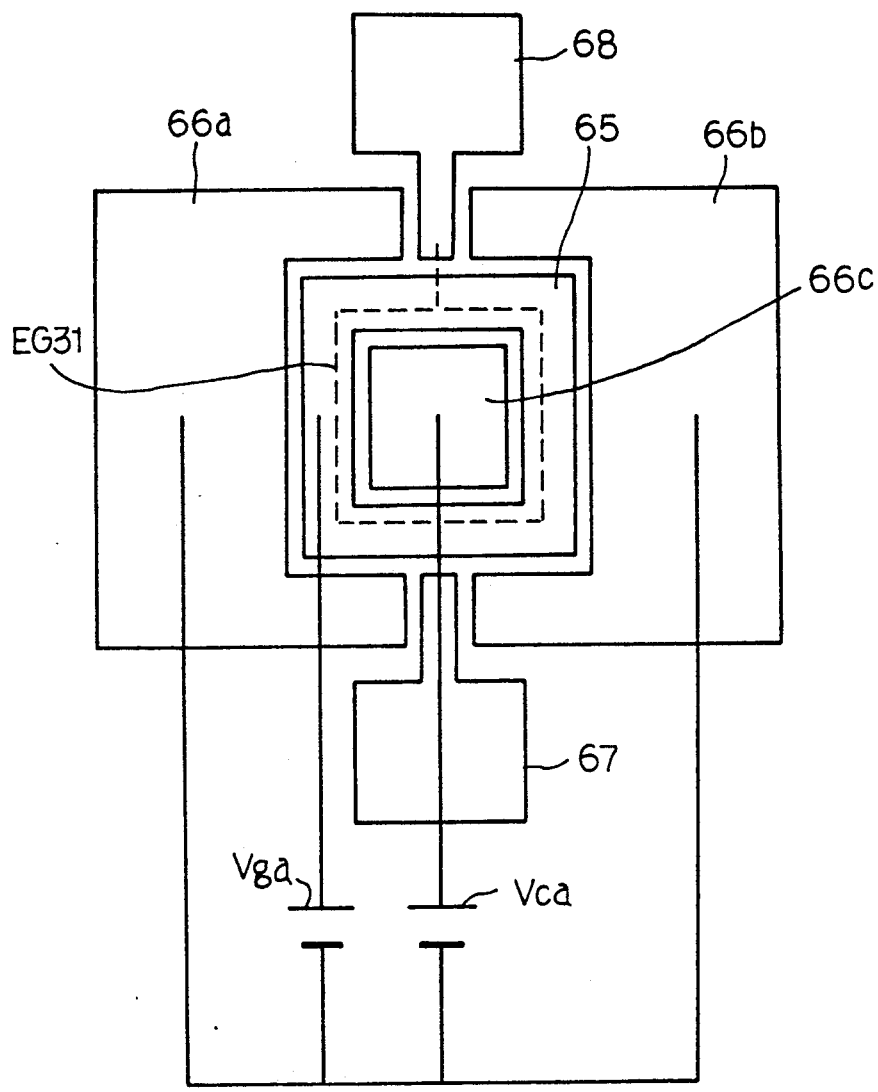
FIG. 16 is a plan view showing the quasi one-dimensional electron gas with respect to the electrodes incorporated in the field effect transistor shown in FIG. 15.

The source and drain electrodes 67 and 68 may have respective narrow projecting portions as shown in FIG. 16.

In operation, the gate electrode 65 is positively biased with respect to the control electrodes 66a and 66b, and the control electrode 66c is further positively biased with respect to the control electrodes 66a and 66b. Electron resonance takes place between the electron energy level in the cap layer 63 and the ground energy level E1 in the potential well layer 62a, and quasi one-dimensional electron gas EG31 extends along the looped gate electrode 65, because differential voltage Vca is applied between the inside of the gate electrode 65 and the outside of the gate electrode 65. The quasi one-dimensional conductive channel is much narrower than the width of the looped gate electrode 65, and current is free from elastic scattering.

If the field effect transistor is cooled and magnetic field is applied in the direction normal to the semi-insulating substrate 61, the conductivity between the source and drain electrodes 67 and 68 is periodically varied, and the field effect transistor serves as an Aharanov-Bohm element.

Although particular embodiments of the present invention have been shown and described, it will be obvious to those skilled in the art that various changes and modifications may be made without departing from the spirit and scope of the present invention. For example, the component compound semiconductor films may be grown through a suitable deposition technique except for the molecular beam epitaxy, and a gate electrode may be ring-shaped.

What is claimed is:

1. A field effect transistor fabricated on a semi-insulating substrate, comprising:
   a) a quantum well structure formed over said semi-insulating substrate, and having a quantum well layer of first compound semiconductor material sandwiched between first and second potential barrier layers of respective second and third compound semiconductor materials, said second and third compound semiconductor materials being smaller in electron affinity than said first compound semiconductor material, said second potential barrier layer allowing electrons to tunnel therethrough;

b) a cap layer of n-type fourth compound semiconductor material covering said second potential barrier layer;

c) source and drain electrodes formed on said cap layer for forming ohmic contacts, and spaced apart from one another in a first predetermined direction;

d) a gate electrode formed on said cap layer between said source and drain electrodes, and forming a first Schottky barrier with said fourth compound semiconductor material, and e) control electrodes formed on said cap layer for forming second and third Schottky barriers with said fourth compound semiconductor material, and spaced apart from said gate electrode in a second predetermined direction perpendicular to said first predetermined direction, said gate electrode and said control electrodes being biased in such a manner as to produce a quasi one-dimensional electron gas in said quantum well layer under electron resonance between electron energy in said cap layer and the ground energy level in said quantum well layer for allowing current to flow between said source and drain electrodes.

2. A field effect transistor as set forth in claim 1, in which said cap layer is thin enough to be depleted between said gate electrode and said control electrodes when said gate electrode and said control electrodes are biased.

3. A field effect transistor as set forth in claim 2, in which said cap layer is 50 angstroms in thickness.

4. A field effect transistor as set forth in claim 1, in which said n-type fourth semiconductor material is gallium arsenide doped at $1 \times 10^{18}$ cm$^{-3}$, and said first compound semiconductor material is intentionally undoped gallium arsenide.

5. A field effect transistor as set forth in claim 4, in which said gate electrode is 0.5 micron in width for confining said quasi one-dimensional electron gas in an area of said quantum well layer as narrow as 250 angstroms.

6. A field effect transistor as set forth in claim 4, in which said semi-insulating substrate is formed of gallium arsenide, and in which said second and third compound semiconductor materials are intentionally undoped aluminum gallium arsenide.

7. A field effect transistor as set forth in claim 6, further comprising a buffer layer of intentionally undoped gallium arsenide formed between said semi-insulating substrate and said first potential barrier layer of aluminum gallium arsenide.

8. A metal semiconductor field effect transistor as set forth in claim 1, in which said third compound semiconductor material for said second potential barrier layer is doped with n-type dopant for supplying electrons to said quasi one-dimensional electron gas.

9. A metal semiconductor field effect transistor as set forth in claim 8, in which said first, second, third and fourth compound semiconductor materials are intentionally undoped gallium arsenide, intentionally undoped aluminum gallium arsenide, n-type aluminum gallium arsenide and n-type gallium arsenide, respectively.

10. A field effect transistor as set forth in claim 9, in which said n-type gallium arsenide for said cap layer is doped at $1 \times 10^{18}$ cm$^3$.

11. A field effect transistor as set forth in claim 9, in which said n-type aluminum gallium arsenide is doped at $3 \times 10^{18}$ cm$^{-3}$.

12. A field effect transistor as set forth in claim 9, further comprising a buffer layer of intentionally undoped gallium arsenide formed between said semi-insulating substrate and said first potential barrier layer of intentionally undoped aluminum gallium arsenide.

13. A field effect transistor as set forth in claim 12, in which said cap layer has thick portions and a recess region between said thick portions, said gate electrode and said control electrodes being located on said recess region, said source and drain electrodes being located on said thick portions, respectively.

14. A field effect transistor as set forth in claim 9, further comprising a buffer layer of n-type gallium arsenide formed between said semi-insulating substrate and said first potential barrier layer.

15. A field effect transistor as set forth in claim 14, in which said cap layer has thick portions and a recess region between said thick portions, said gate electrode and said control electrodes being located on said recess region, said source and drain electrodes being located on said thick portions, respectively.

16. A field effect transistor as set forth in claim 1, in which said drain electrode is implemented by a plurality of drain sub-electrodes electrically isolated from one another for allowing said quasi one-dimensional electron gas to selectively flow from said source electrode to said plurality of drain sub-electrodes.

17. A metal semiconductor field effect transistor as set forth in claim 16, in which said third compound semiconductor material for said second potential barrier layer is doped with n-type dopant for supplying electrons to said quasi one-dimensional electron gas.

18. A metal semiconductor field effect transistor as set forth in claim 16, in which said semi-insulating substrate is formed of gallium arsenide, and in which said first, second, third and fourth compound semiconductor materials are intentionally undoped gallium arsenide, intentionally undoped aluminum gallium arsenide, n-type aluminum gallium arsenide and n-type gallium arsenide, respectively.

19. A field effect transistor as set forth in claim 18, in which said n-type gallium arsenide for said cap layer is doped at $5 \times 10^{18}$ cm$^{-3}$.

20. A field effect transistor as set forth in claim 18, in which said n-type aluminum gallium arsenide is doped at $3 \times 10^{18}$ cm$^{-3}$.

21. A field effect transistor as set forth in claim 18, further comprising a buffer layer of n-type gallium arsenide formed between said semi-insulating substrate and said first potential barrier layer of intentionally undoped aluminum gallium arsenide.

22. A field effect transistor as set forth in claim 1, in which said source electrode and said drain electrode are implemented by a plurality of source sub-electrodes electrically isolated from one another and a plurality of drain sub-electrodes electrically isolated from one another, respectively, for allowing said quasi-one dimensional electron gas to selectively flow between said plurality of source sub-electrodes and said plurality of drain sub-electrodes.

23. A metal semiconductor field effect transistor as set forth in claim 22, in which said third compound semiconductor material for said second potential barrier layer is doped with n-type dopant for supplying electrons to said quasi one-dimensional electron gas.

24. A metal semiconductor field effect transistor as set forth in claim 22, in which said semi-insulating substrate is formed of gallium arsenide, and in which said first, second, third and fourth compound semiconductor materials are intentionally undoped gallium arsenide, intentionally undoped aluminum gallium arsenide, n-type aluminum gallium arsenide and n-type gallium arsenide, respectively.

25. A field effect transistor as set forth in claim 24, in which said n-type gallium arsenide for said cap layer is doped at $5 \times 10^{18}$ cm$^{-3}$.

26. A field effect transistor as set forth in claim 24, in which said n-type aluminum gallium arsenide is doped at $3 \times 10^{18}$ cm$^{-3}$.

27. A field effect transistor as set forth in claim 24, further comprising a buffer layer of n-type gallium arsenide formed between said semi-insulating substrate and said first potential barrier layer of intentionally undoped aluminum gallium arsenide.

28. A field effect transistor as set forth in claim 1, in which said gate electrode has a stem portion and first and second branch portions bifurcated from one end of said stem portion, said control electrodes confronting said stem and first branch portions and said stem and second branch portions, respectively, an additional control electrode confronting said first and second branch portions, said source electrode confronting the other end of said stem portion, said drain electrode being implemented by first and second drain subelectrodes electrically isolated from one another and confronting said first and second branch portions, respectively, said gate electrode being positively biased with respect to said additional control electrode, one of said control electrodes being positively biased with respect to said additional control electrode, the other of said control electrodes being equipotential with respect to said additional control electrode.

29. A metal semiconductor field effect transistor as set forth in claim 28, in which said semi-insulating substrate is formed of gallium arsenide, and in which said first, second, third and fourth compound semiconductor materials are intentionally undoped indium gallium arsenide, intentionally undoped aluminum gallium arsenide, intentionally undoped aluminum gallium arsenide and n-type gallium arsenide, respectively.

30. A field effect transistor as set forth in claim 29, in which said n-type gallium arsenide for said cap layer is doped at $1 \times 10^{18}$ cm$^{-3}$.

31. A field effect transistor as set forth in claim 29, in which said intentionally undoped indium gallium arsenide and said intentionally undoped aluminum gallium arsenide are respectively expressed by the chemical formulae of $In_{0.15}Ga_{0.85}As$ and $Al_{0.3}Ga_{0.7}As$.

32. A field effect transistor as set forth in claim 29, further comprising a buffer layer of intentionally undoped gallium arsenide formed between said semi-insulating substrate and said first potential barrier layer of intentionally undoped aluminum gallium arsenide.

33. A field effect transistor as set forth in claim 1, in which said gate electrode has a looped configuration forming a hollow space inside thereof, said control electrodes confronting an outer surface of said gate electrode and spaced apart from each other, an additional control gate being formed on said cap layer within said hollow space, said gate electrode being positively biased with respect to said control electrodes, said additional control electrode being positively biased with respect to said control electrodes, magnetic field being applied in a direction normal to said semi-insulating substrate.

34. A metal semiconductor field effect transistor as set forth in claim 33, in which said semi-insulating substrate is formed of indium phosphide, and in which said first, second, third and fourth compound semiconductor materials are intentionally undoped indium gallium arsenide, intentionally undoped indium aluminum arsenide, intentionally undoped indium aluminum arsenide and n-type indium gallium arsenide, respectively.

35. A field effect transistor as set forth in claim 34, in which said n-type indium gallium arsenide for said cap layer is doped at $5 \times 10^{18}$ cm$^{-3}$.

36. A field effect transistor as set forth in claim 34, in which said intentionally undoped indium gallium arsenide and said intentionally undoped indium aluminum arsenide are respectively expressed by the chemical formulae of $In_{0.53}Ga_{0.47}As$ and $In_{0.52}Al_{0.48}As$, and in which said cap layer is formed of n-type indium gallium arsenide expressed by the chemical formula of $In_{0.53}Ga_{0.47}As$.

* * * * *

UNITED STATES PATENT AND TRADEMARK OFFICE
CERTIFICATE OF CORRECTION

PATENT NO. : 5,285,081
DATED : Feb. 8, 1994
INVENTOR(S) : Yuji Ando

It is certified that error appears in the above-indentified patent and that said Letters Patent is hereby corrected as shown below:

Col. 14, line 5, delete "$cm^3$" and insert --$cm^{-3}$--.

Signed and Sealed this

Sixteenth Day of August, 1994

Attest:

BRUCE LEHMAN

*Attesting Officer*     *Commissioner of Patents and Trademarks*